(12) United States Patent
Zhang (10) Patent No.: US 10,839,765 B2
(45) Date of Patent: Nov. 17, 2020

(54) GOA DETECTION CIRCUIT AND TESTING METHOD THEREFOR

(71) Applicant: Wuhan China Star Optoelectronics Semiconductor Display Technology Co., Ltd., Wuhan (CN)

(72) Inventor: Di Zhang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/476,321

(22) PCT Filed: Oct. 12, 2018

(86) PCT No.: PCT/CN2018/109930
§ 371 (c)(1),
(2) Date: Jul. 8, 2019

(87) PCT Pub. No.: WO2020/062336
PCT Pub. Date: Apr. 2, 2020

(65) Prior Publication Data
US 2020/0152151 A1 May 14, 2020

(51) Int. Cl.
*G09G 3/36* (2006.01)
*G01R 31/28* (2006.01)

(52) U.S. Cl.
CPC ....... *G09G 3/3677* (2013.01); *G01R 31/2825* (2013.01)

(58) Field of Classification Search
CPC .......................... G09G 3/3677; G01R 31/2825
See application file for complete search history.

(56) References Cited

U.S. PATENT DOCUMENTS

| | | | |
|---|---|---|---|
| 9,257,083 B2 * | 2/2016 | Dai | G09G 3/006 |
| 2011/0169793 A1 * | 7/2011 | Chen | G09G 3/3677 |
| | | | 345/205 |
| 2014/0063366 A1 * | 3/2014 | Zhang | G02B 30/27 |
| | | | 349/12 |
| 2016/0125775 A1 | 5/2016 | Lv | |
| 2016/0240158 A1 * | 8/2016 | Xu | G11C 19/28 |
| 2016/0259455 A1 * | 9/2016 | Li | G06F 3/0412 |

FOREIGN PATENT DOCUMENTS

| | | |
|---|---|---|
| CN | 104062784 | 9/2014 |
| CN | 105976745 | 9/2016 |
| CN | 106448522 | 2/2017 |
| CN | 107068084 | 8/2017 |
| CN | 108154833 | 6/2018 |

* cited by examiner

*Primary Examiner* — Chanh D Nguyen
*Assistant Examiner* — Ngan T. Pham-Lu (57) ABSTRACT

The present disclosure provides a gate on array (GOA) detection circuit and a detection method. The GOA detection circuit includes a GOA circuit module and a detection signal collection module. The GOA circuit module includes a plurality of scanning lines, a GOA circuit, a plurality of common control thin film transistors (TFT), and a plurality of single-stage control TFTs. An output end of each scanning line is connected to a signal collection line. A gate of each common control TFT is connected to a detection signal control wire of the detection signal collection module, and a source of each common control TFT is connected to the signal collection line. A test point for detecting an electrical signal is disposed on the signal collection line.

14 Claims, 6 Drawing Sheets

GOA DETECTION CIRCUIT AND TESTING METHOD THEREFOR

RELATED APPLICATIONS

This application is a National Phase of PCT Patent Application No. PCT/CN2018/109930 having International filing date of Oct. 12, 2018, which claims the benefit of priority of Chinese Patent Application No. 201811118911.9 filed on Sep. 25, 2018. The contents of the above applications are all incorporated by reference as if fully set forth herein in their entirety.

FIELD AND BACKGROUND OF THE INVENTION

The present disclosure relates to the field of display technologies, and in particular, to a gate on array (GOA) detection circuit and a testing method therefor.

A liquid crystal display (LCD) has many advantages, such as a thin body, a power saving feature, and no radiation, and is widely applied. For example, LCD televisions, mobile phones, personal digital assistants, digital cameras, computer screens, or notebook computer screens are dominant in the flat panel display field.

Most of LCDs in the current market are backlight-type LCDs. A backlight-type LCD includes an LCD panel and a backlight module. A working principle of the LCD panel is: pouring liquid crystal molecules between a thin film transistor (TFT) array substrate and a color filter (CF) substrate, and applying a drive voltage to the two substrates to control a rotation method of the liquid crystal molecules, to refract light of the backlight module to generate a picture.

An active matrix LCD is the most commonly used LCD at present, and includes a plurality of pixels. Each pixel is controlled by one TFT. A gate of the TFT is connected to a scanning line extending in a horizontal direction, a source of the TFT is connected to a data line in a vertical direction, and a drain of the TFT is connected to a corresponding pixel electrode. When a sufficient positive voltage is applied to a scanning line in the horizontal direction, all TFTs connected to the scanning line are turned on, and a data signal voltage loaded onto a data line is written into a pixel electrode, to control transmittance of different liquid crystals, thereby achieving an effect of controlling colors.

Technical Problem

An external intergraded circuit (IC) is initially utilized to drive a scanning line (i.e., gate driving) in an active matrix LCD, and the external IC can control charging and discharging of each stage of horizontal scanning line. In a GOA technology, a drive circuit of a horizontal scanning line can be formed on a substrate around a display area by utilized array manufacturing process of LCD panel, to replace an external IC to drive the horizontal scanning line. Especially, with the development of display panels, a larger screen, higher resolution, and a more exciting visual effect are pursued. Therefore, higher requirements on a panel manufacturing process, a material, and a technique are raised. During filtering of panel yields of LCD or organic light-emitting diode (OLED) display screens, a working status of a GOA drive circuit of a screen is focused on. This has very significant impact on total product production.

SUMMARY OF THE INVENTION

To achieve the foregoing objective, the present disclosure provides a gate on array (GOA) detection circuit and a testing method therefor. Compared with a present GOA stage-transmission circuit, a data collection wire and a thin film transistor (TFT) are added to the present GOA detection circuit, and a unilateral conduction control TFT is unilaterally conducted to work as a unilateral conduction diode so that interference between different stages of GOA signals is blocked. A time signal control system is adjusted (including controlling a detection signal control wire and a reset signal) in order to collect information, in a signal, indicating whether reading each stage of GOA signal is abnormal. In addition, the unilateral conduction TFT is controlled by using a plurality of groups of signals to implement multi-pulse abnormality detection and determine an abnormality position. According to the testing method, a yield of a GOA unit can be rapidly determined, and a fault of the GOA unit and a multi-pulse position can be accurately determined. Therefore, to subsequent facilitate repairing, fault analysis, and design improvement of a display panel.

An objective of the present disclosure is to provide a GOA detection circuit. The GOA detection circuit includes a GOA circuit module and a detection signal collection module. The GOA circuit module includes a plurality of scanning lines spaced in parallel and a GOA circuit electrically connected to the plurality of scanning lines. An output end of each scanning line is electrically connected to a signal collection line. The GOA circuit includes a plurality of cascaded GOA units. Each GOA unit is electrically connected to a scanning signal output end. Each scanning signal output end is correspondingly electrically connected to a scanning line. The GOA circuit module further includes a plurality of common control TFTs and a plurality of single-stage control TFTs. A gate of each common control TFT is electrically connected to a detection signal control wire of the detection signal collection module. A source of each common control TFT is electrically connected to the signal collection line. A single-stage control TFT is disposed on each scanning line. A drain of each single-stage control TFT is electrically connected to each scanning signal output end. A source of each single-stage control TFT is electrically connected to a drain of each common control TFT. A gate of each single-stage control TFT is electrically connected to a single-stage signal control wire. A test point for detecting an electrical signal is disposed on the signal collection line. The GOA circuit module further includes a plurality of unilateral conduction components. Each of the unilateral conduction component is disposed on each scanning line. Each of the unilateral conduction component is configured to prevent mutual interference between output signals of different stages of GOA units. The gate of each common control TFT and the gate of each single-stage control TFT are electrically connected to a phase inverter.

An objective of the present disclosure is to provide a GOA detection circuit. The GOA detection circuit includes a GOA circuit module and a detection signal collection module. The GOA circuit module includes a plurality of scanning lines spaced in parallel and a GOA circuit electrically connected to the plurality of scanning lines. An output end of each scanning line is electrically connected to a signal collection line. The GOA circuit includes a plurality of cascaded GOA units. Each GOA unit is electrically connected to a scanning signal output end. Each scanning signal output end is correspondingly electrically connected to a scanning line. The GOA circuit module further includes a plurality of common control TFTs and a plurality of single-stage control TFTs. A gate of each common control TFT is electrically connected to a detection signal control wire of the detection signal collection module. A source of each common control TFT is electrically connected to the signal collection line. A single-stage control TFT is disposed on each scanning line. A drain of each single-stage control TFT is electrically connected to each scanning signal output end. A source of each single-stage control TFT is electrically connected to a drain of each common control TFT. A gate of each single-stage control TFT is electrically connected to a single-stage signal control wire. A test point for detecting an electrical signal is disposed on the signal collection line.

In an embodiment of the present disclosure, the GOA circuit module further includes a plurality of unilateral conduction components. Each unilateral conduction component is disposed on each scanning line. Each unilateral conduction component is configured to prevent mutual interference between output signals of different stages of GOA units.

In an embodiment of the present disclosure, the unilateral conduction component is a unilateral conduction control TFT. When an output signal of the GOA unit is a negative voltage pulse signal, a drain of the unilateral conduction control TFT is electrically connected to a gate of the unilateral conduction control TFT using a phase inverter.

In an embodiment of the present disclosure, the unilateral conduction component is a unilateral conduction control TFT. When an output signal of the GOA unit is a negative voltage pulse signal, a source of the unilateral conduction control TFT is electrically connected to a gate of the unilateral conduction control TFT.

In an embodiment of the present disclosure, the unilateral conduction component is a unilateral conduction control TFT. When an output signal of the GOA unit is a positive voltage pulse signal, a source of the unilateral conduction control TFT is electrically connected to a gate of the unilateral conduction control TFT using a phase inverter.

In an embodiment of the present disclosure, the unilateral conduction component is a unilateral conduction control TFT. When an output signal of the GOA unit is a positive voltage pulse signal, a drain of the unilateral conduction control TFT is electrically connected to a gate of the unilateral conduction control TFT.

In an embodiment of the present disclosure, the gate of each common control TFT and the gate of each single-stage control TFT are electrically connected to a phase inverter.

In an embodiment of the present disclosure, the detection signal collection module further includes a reset component and a capacitor. The reset component is a reset control TFT. A gate of the reset control TFT receives a reset signal. A source of the reset control TFT is electrically connected to the signal collection line. A drain of the reset control TFT receives a high-level voltage signal. When the gate of the reset control TFT receives the reset signal, the signal collection line obtains a voltage level according to the signal received by the drain of the reset control TFT. One end of the capacitor is connected to the signal collection line. The capacitor is used for storing electrical charge.

In an embodiment of the present disclosure, the detection signal collection module further includes a reset component and a capacitor. The reset component is a reset control TFT. A gate of the reset control TFT receives a reset signal. A source of the reset control TFT is electrically connected to the signal collection line. A drain of the reset control TFT receives a low-level voltage signal. When the gate of the reset control TFT receives the reset signal, the signal collection line obtains a voltage level signal according to the low-level voltage signal received by the drain of the reset control TFT. One end of the capacitor is connected to the signal collection line. The capacitor is used for storing electrical charge.

In addition, the present disclosure further provides a testing method for a GOA detection circuit. The method includes the following steps: (a) providing a GOA detection circuit, wherein the GOA detection circuit includes a GOA circuit module and a detection signal collection module; the GOA circuit module includes a plurality of scanning lines spaced in parallel and a GOA circuit electrically connected to the plurality of scanning lines; an output end of each scanning line is electrically connected to a signal collection line; the GOA circuit includes a plurality of cascaded GOA units; each GOA unit is electrically connected to a scanning signal output end; each scanning signal output end is correspondingly electrically connected to a scanning line; the GOA circuit module further includes a plurality of common control TFTs and a plurality of single-stage control TFTs; a gate of each common control TFT is electrically connected to a detection signal control wire of the detection signal collection module; a source of each common control TFT is electrically connected to the signal collection line; a single-stage control TFT is disposed on each scanning line; a drain of each single-stage control TFT is electrically connected to each scanning signal output end; a source of each single-stage control TFT is electrically connected to a drain of each common control TFT; and a gate of each single-stage control TFT is electrically connected to a single-stage signal control wire; (b) controlling the detection signal control wire and the single-stage signal control wire, to perform on-off detection on the GOA circuit module; and (c) disposing a test point for detecting a voltage signal on the signal collection line, and determining on-off of a corresponding GOA unit according to voltage waveform of the test point for detecting a voltage signal.

In an embodiment of the present disclosure, in the step (b), when an input voltage of the detection signal control wire is at a low level, and an input voltage of each single-stage signal control wire is a low voltage, each single-stage control TFT in the GOA circuit module is in an on state, to perform on-off detection on each GOA unit.

In an embodiment of the present disclosure, before the step (b), the method further includes: before each GOA unit outputs a signal, receiving, by a reset component of the detection signal collection module, a reset signal, to reset the GOA circuit module.

In an embodiment of the present disclosure, in the step (b), when an input voltage of the detection signal control wire is at a low level, an input voltage of one of the plurality of single-stage signal control wires is a low voltage, and input voltages of the other single-stage signal control wires are high voltages, a single-stage control TFT, in the GOA circuit module, corresponding to the single-stage signal control wire whose input voltage is the low voltage is in an on state, and the other single-stage control TFTs are in an off state, to perform on-off detection on the corresponding GOA unit.

Beneficial Effects

Compared with a present GOA stage-transmission circuit, a data collection wire and a TFT are added to the present GOA detection circuit, and a unilateral conduction TFT that achieves a function of a unilateral conduction diode is configured to block interference between different stages of GOA signals. A time signal control system is adjusted (including controlling a detection signal control wire and a reset signal) in order to collect information, in a signal, indicating whether each stage of GOA signal is abnormal. In addition, the unilateral conduction control TFT is controlled using a plurality of groups of signals, to implement multi-pulse abnormality detection and determine an abnormality position. According to the testing method, a yield of a GOA unit can be rapidly determined, and a fault of the GOA unit and a multi-pulse position can be accurately determined, to facilitate later repairing, fault analysis, and design improvement of a display panel.

BRIEF DESCRIPTION OF THE SEVERAL VIEWS OF THE DRAWINGS

To describe the technical solutions in the embodiments of the present disclosure more clearly, the following briefly describes the accompanying drawings required for describing the embodiments. Apparently, the accompanying drawings in the following description show merely some embodiments of the present disclosure, and a person skilled in the art may still derive other drawings from these accompanying drawings without creative efforts.

DESCRIPTION OF SPECIFIC EMBODIMENTS OF THE INVENTION

The following clearly and completely describes the technical solutions in the embodiments of the present disclosure with reference to the accompanying drawings in the embodiments of the present disclosure. Apparently, the described embodiments are only some embodiments rather than all the embodiments of the present disclosure. All other embodiments obtained by a person skilled in the art based on the embodiments of the present disclosure without creative efforts shall fall within the protection scope of the present disclosure.

In this specification, the claims, and the foregoing accompanying drawings of the present disclosure, the terms "first", "second", "third", and so on (if they exist) are intended to distinguish between similar objects but do not necessarily indicate a specific order or sequence. It should be understood that the objects described in such a way are interchangeable in proper circumstances. In addition, the terms "including", "having", or any other variant thereof are intended to cover a non-exclusive inclusion.

In the document of this patent, the accompanying drawings described below, and embodiments configured to describe the principle disclosed in the present disclosure are intended to be illustrative only and are not to be construed as limiting the scope of the disclosure of the present disclosure. A person skilled in the art should understand that, the principle of the present disclosure can be implemented in any system properly disposed. Exemplary implementations are described in detail, and examples of these implementations are shown in the accompanying drawings. In addition, a terminal according to an exemplary embodiment is described in detail with reference to the accompanying drawings. Same reference numerals in the accompanying drawings indicate same elements.

Terms used in this specification of the present disclosure are used only to describe particular implementations, and are not intended to show the concept of the present disclosure. Unless otherwise described to have different meanings in the context, expressions used in a singular form cover expressions in a plural form. In this specification of the present disclosure, it should be understood that, terms, such as "include", "have", and "contain" are intended to describe a possibility of existence of the features, numbers, steps, actions, or combinations thereof disclosed in this specification of the present disclosure, and are not intended to exclude a possibility that one or more other features, numbers, steps, actions, or combinations thereof may exist or may be added. Same reference numerals in the accompanying drawings indicate same parts.

An embodiment of the present disclosure provides a gate on array (GOA) detection circuit. Detailed descriptions are provided below separately.

Referring to FIG. 1 to FIG. 6, the present disclosure provides a GOA detection circuit in a first embodiment.

Figure 1:
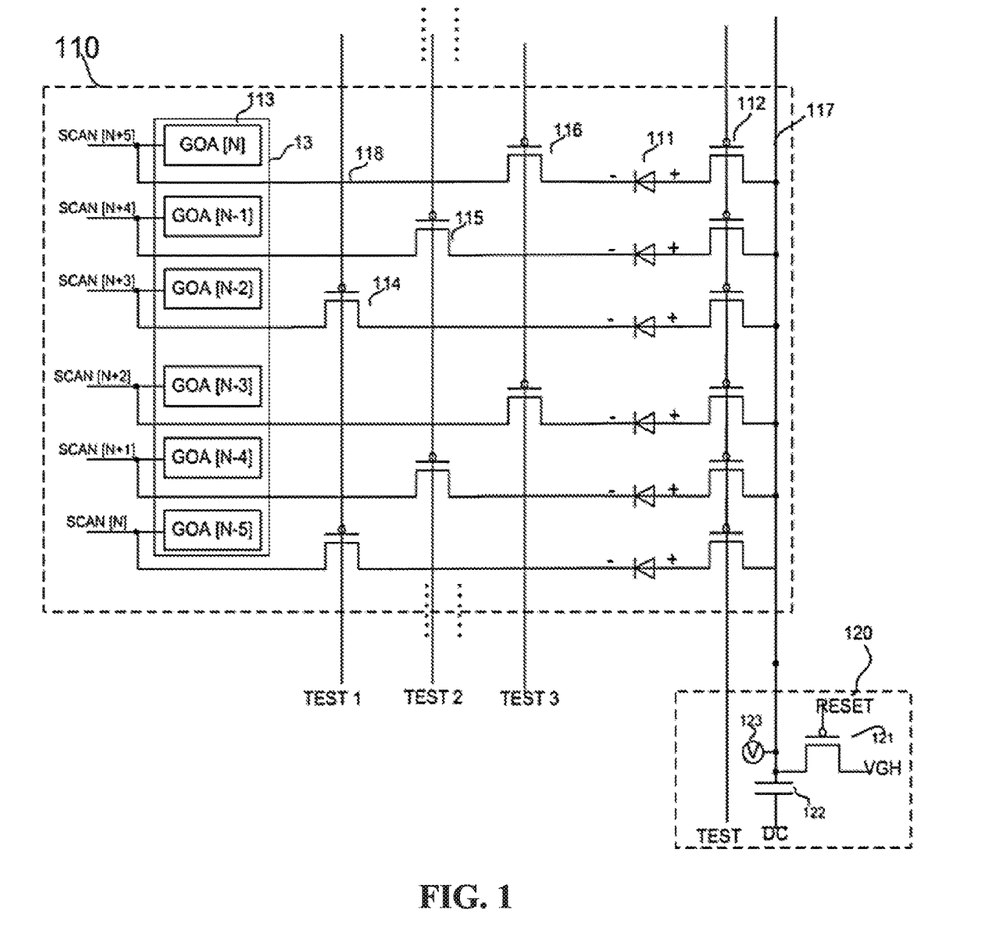
FIG. 1 is a schematic diagram of a gate on array (GOA) detection circuit according to a first embodiment of the present disclosure, wherein a GOA unit outputs a negative voltage pulse signal.

The GOA detection circuit includes a GOA circuit module 110 and a detection signal collection module 120. The GOA circuit module 110 includes a plurality of scanning lines 118 spaced in parallel, a plurality of data lines spaced in parallel (not shown in the figure), and a GOA circuit 13 electrically connected to the plurality of scanning lines 118. An output end of each scanning line 118 is electrically connected to a signal collection line 117. It should be noted that, the output end of each scanning line 118 is electrically connected to the same signal collection line 117.

The GOA circuit includes a plurality of cascaded GOA units 113. Each GOA unit 113 is electrically connected to a scanning signal output end. Each scanning signal output end is correspondingly electrically connected to a scanning line. In the present embodiment, an output end of a scanning signal SCAN[N+5] is electrically connected to a GOA unit GOA[N], an output end of a scanning signal SCAN[N+4] is electrically connected to a GOA unit GOA[N−1], an output end of a scanning signal SCAN[N+3] is electrically connected to a GOA unit GOA[N−2], an output end of a scanning signal SCAN[N+2] is electrically connected to a GOA unit GOA[N−3], an output end of a scanning signal SCAN[N+1] is electrically connected to a GOA unit GOA[N−4], and an output end of a scanning signal SCAN[N] is electrically connected to a GOA unit GOA[N−5]. It should be noted that, for example, SCAN[N+5], SCAN[N+4], and SCAN[N+3] respectively indicate different scanning signals; and GOA units GOA[N], GOA[N−1], and GOA[N−2] respectively indicate different GOA units.

The GOA circuit module 110 further includes a plurality of common control thin film transistors (TFTs) 112 and a plurality of single-stage control TFTs (for example, TFTs 114, 115, and 116). A gate of each common control TFT 112 is electrically connected to a detection signal control wire of the detection signal collection module 120. A source of each common control TFT 112 is electrically connected to the signal collection line 117. The gate of each common control TFT 112 is electrically connected to a phase inverter. To be specific, the gates of the common control TFTs 112 are controlled by the detection signal control wire TEST.

A single-stage control TFT (for example, TFTs 114, 115, or 116) is disposed on one of scanning line. A drain of each single-stage control TFT is electrically connected to one scanning signal output end. A source of each single-stage control TFT is electrically connected to a drain of one common control TFT 112. A gate of each single-stage control TFT is electrically connected to a single-stage signal control wire. In the present embodiment, a single-stage control TFT is disposed on one stage of scanning line. Referring to FIG. 1, single-stage control TFTs in a $(3N-2)^{th}$ row are connected to the same column of single-stage control TFTs, such as TFT 114, wherein [N=1, 2, 3, . . . , an integer]. Single-stage control TFTs in a $(3N-1)^{th}$ row are connected to the same column of single-stage control TFTs, such as TFT 115, wherein [N=1, 2, 3, . . . , an integer]. Single-stage control TFTs in a $3N^{th}$ row are connected to the same column of single-stage control TFTs, such as TFT 116, wherein [N=1, 2, 3, . . . , an integer]. A gate of the single-stage control TFTs, such as TFT 114, in the $(3N-2)^{th}$ row is controlled by, for example, a first single-stage signal control wire TEST1. A gate of the single-stage control TFTs, such as TFT 115, in the $(3N-1)^{th}$ row is controlled by, for example, a second single-stage signal control wire TEST2. A gate of the single-stage control TFTs, such as TFT 116, in the $3N^h$ row is controlled by, for example, a third single-stage signal control wire TEST3. The gate of each common control TFT 112 and the gate of each single-stage control TFT are electrically connected to a phase inverter (not indicated in the figure). Therefore, when the gate of the common control TFT 112 and the single-stage control TFT receive a low-level voltage signal, the gate of the common control TFT 112 and the single-stage control TFT are turned on, when receiving a high-level voltage signal, the gate of the common control TFT 112 and the single-stage control TFT are turned off. In this way, it is equivalent to that the GOA detection circuit is turned off thus the GOA circuit module resumes working normally. In addition, it should be noted that, the voltage signal received by the gate of the common control TFT 112 and the single-stage control TFT is a direct current (DC) signal, because all detection switches controlling the GOA units 113 should be wholly turned on or turned off. In addition, the signal collection line 117 also receives a DC voltage signal. DC means a direct current power.

Still referring to FIG. 1. The detection signal control wire TEST is configured to enable or disable a function for detecting the GOA circuit module 110. The detection signal control wire TEST and the single-stage signal control wire (for example, TEST1, TEST2, or TEST3) control a corresponding common control TFT 112 and a corresponding single-stage control TFT (for example, 114, 115, or 116) in order to perform on-off detection on a corresponding GOA unit 113.

In addition, a test point for detecting an electrical signal is disposed on the signal collection line 117. In the present embodiment, a test point 123 for detecting a voltage signal is disposed on the signal collection line 117. The test point 123 for detecting a voltage signal is configured to determine on-off status of the corresponding GOA unit 113 according a voltage waveform of the test point 123. How to determine on-off of the corresponding GOA unit 113 according the voltage waveform is further described below. Certainly, in some other embodiments, a test point for detecting an electric current signal may alternatively be disposed on the signal collection line 117. The test point for detecting an electric current signal is configured to determine on-off status of the corresponding GOA unit 113 according an electric current waveform of the test point for detecting an electric current signal.

In the present embodiment, the GOA circuit module 110 further includes a plurality of unilateral conduction components 111. Each unilateral conduction component 111 is disposed on each scanning line. Each unilateral conduction component 111 is configured to prevent mutual interference between output signals of different stages of GOA units 113 (namely, mutual interference between drive signals). When the common control TFT 112 and the single-stage control TFT are turned on, and a signal output by the corresponding GOA unit 113 is collected using the signal collection line 117, an electric current flows from the signal collection line 117 to the GOA unit 113. When the common control TFT 112 and the single-stage control TFT are turned off, no electric current flows between the signal collection line 117 and the GOA unit 113 (the unilateral conduction component 111 achieves a function of reverse cut-off).

Figure 2A:
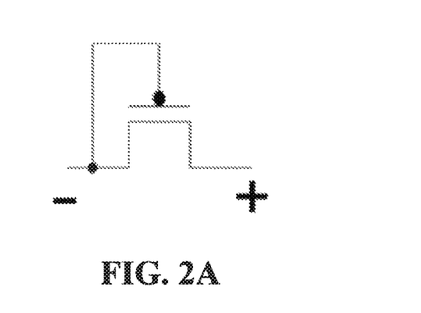
FIG. 2A and FIG. 2B are schematic structural diagrams of a unilateral conduction component in the GOA detection circuit according to the first of the present disclosure.
Figure 2B:
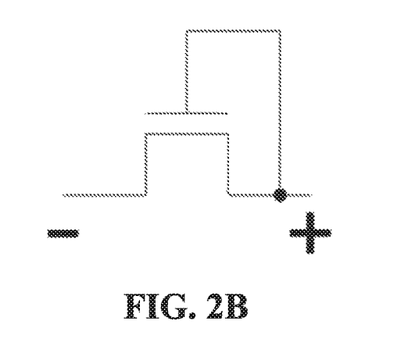

Further, the unilateral conduction component 111 make a TFT be unilaterally conducted. Certainly, in some other embodiments, the unilateral conduction component 111 may alternatively be a diode. In the present embodiment, the unilateral conduction component 111 is a unilateral conduction control TFT. When the output signal of the GOA unit 113 is a negative voltage pulse signal, a drain of the unilateral conduction control TFT is electrically connected to a gate of the unilateral conduction control TFT using a phase inverter, as shown in FIG. 2A; or a source of the unilateral conduction control TFT is electrically connected to a gate of the unilateral conduction control TFT, as shown in FIG. 2B. For example, in a third Embodiment, when the output signal of the GOA unit 113 is a positive voltage pulse signal, a source of the unilateral conduction control TFT is electrically connected to a gate of the unilateral conduction control TFT using a phase inverter; or a drain of the unilateral conduction control TFT is electrically connected to a gate of the unilateral conduction control TFT.

In the present embodiment, the detection signal collection module 120 further includes a reset component 121 and a capacitor 122. One end of the capacitor 122 is connected to the signal collection line 117. The capacitor 122 is used for storing electrical charge. The reset component 121 is a reset control TFT. A gate of the reset control TFT receives a reset signal (RESET). A source of the reset control TFT is electrically connected to the signal collection line 117. A drain of the reset control TFT receives a high-level voltage signal (when the GOA unit 113 outputs a negative voltage pulse signal) or a low-level voltage signal (when the GOA unit 113 outputs a positive voltage pulse signal). When the gate of the reset control TFT receives the reset signal, the signal collection line 117 obtains a voltage level signal according to a high-level voltage signal VGH or a low-level voltage signal VGL received by the drain of the reset control TFT. To be specific, when the GOA unit 113 is detected, if the signal collection line 117 is initially at a low level, when the reset signal is triggered, the signal collection line 117 changes from being at a low level to being at a high level, and charges the capacitor 122. After a reset operation is finished, and next scanning is performed, a signal output by the GOA unit 113 is a low-level voltage signal, to cause the capacitor 122 to discharge. If the signal collection line 117 is initially at a high level, when the reset signal is triggered, the signal collection line 117 changes from being at a high level to being at a low level. In this case, the capacitor 122 discharges.

A working principle of the GOA detection circuit is described below using the first embodiment and a second embodiment.

Figure 3:
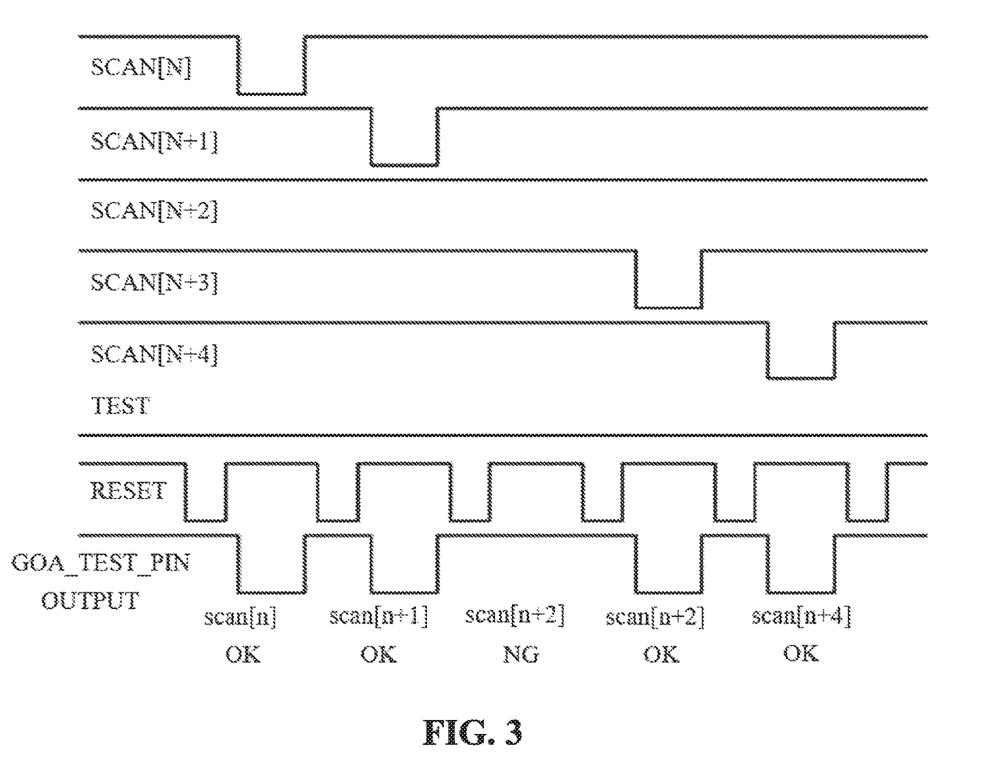
FIG. 3 is a schematic diagram of testing result signals of an abnormal GOA unit in the GOA detection circuit according to the first of the present disclosure, wherein the abnormal GOA unit outputs a negative voltage pulse signal.
Figure 4:
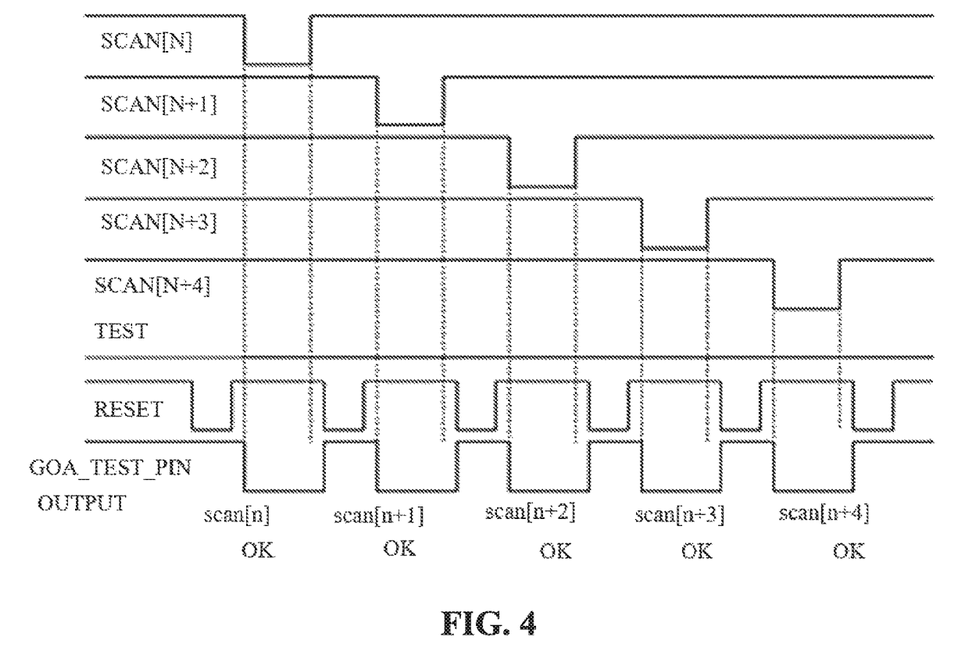
FIG. 4 is a schematic diagram of a testing effect of signals of a normal GOA unit in the GOA detection circuit according to the first of the present disclosure, wherein the normal GOA unit outputs a negative voltage pulse signal.

Referring to FIG. 1 to FIG. 4, the first embodiment is as follows. A low-level voltage signal VGL is input to the detection signal control wire TEST. Similarly, a low-level voltage signal VGL is input to the single-stage signal control wires (which are TEST1, TEST2, and TEST3 herein). Therefore, the common control TFT 112 and the single-stage control TFT are in the on state, and then on-off detection on the GOA unit 113 can start. Under the protection of the unilateral conduction component 111, signals output by the GOA cause no mutual interference between different stages, to be more specific, a GOA signal stage-transmission function is not affected. As shown in FIG. 3 and FIG. 4, SCAN[N] to SCAN[N+4] indicate output signals of stages of GOA units 113, and a RESET signal is an alternating-current (AC) signal, and is turned on before the output signal of each stage of GOA unit 113 is turned on, to reset the entire detection circuit. GOA_TEST_PIN OUTPUT is a waveform detected by the test point 123 for detecting a voltage signal. As shown in FIG. 3, when the signal SCAN[N+2] is abnormally output, to be specific, a corresponding GOA unit (GOA[N−3]) is damaged, in a schematic diagram of a signal testing effect, it is shown that no corresponding pulse appears within a time corresponding to SCAN[N+2]. However, referring to FIG. 4, the output signals of the stages of GOA units 113 indicated by SCAN[N] to SCAN[N+4] are all normal, and in a schematic diagram of a signal testing effect, a normal detection pulse corresponding to each stage of GOA is shown. Therefore, based on a design of the foregoing circuit, an abnormal signal of each stage of GOA unit 113 can be rapidly and accurately determined, to facilitate accurate locating and analysis of an abnormality problem of the GOA unit 113, and filtering of an array test of an LCD panel.

Figure 5:
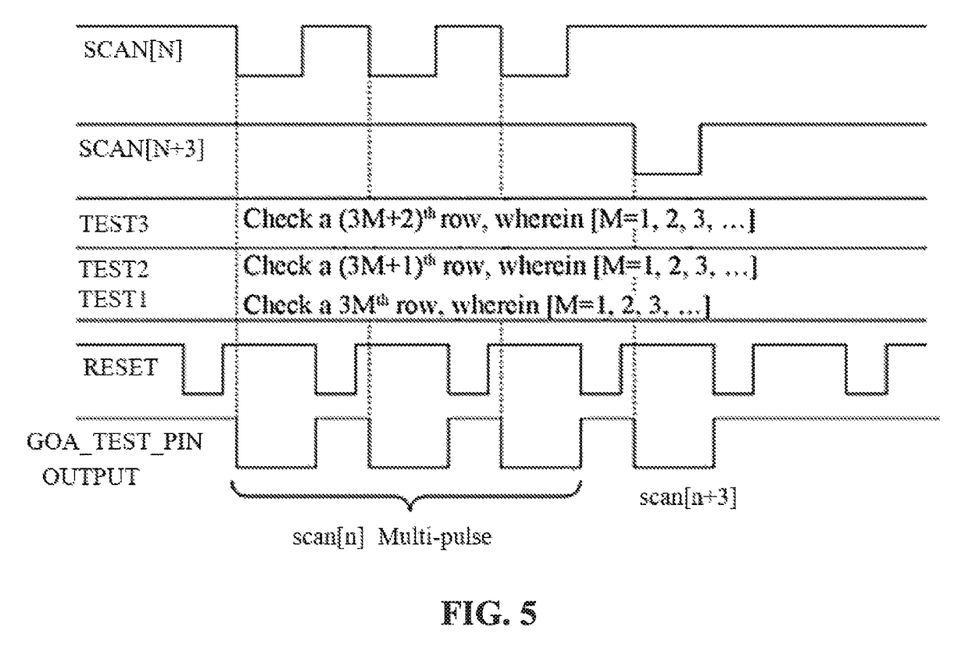
FIG. 5 is a schematic diagram of a detection time sequence when a GOA unit in a GOA detection circuit is abnormal according to a second embodiment of the present disclosure, wherein the abnormal GOA unit outputs a negative voltage pulse signal.
Figure 6:
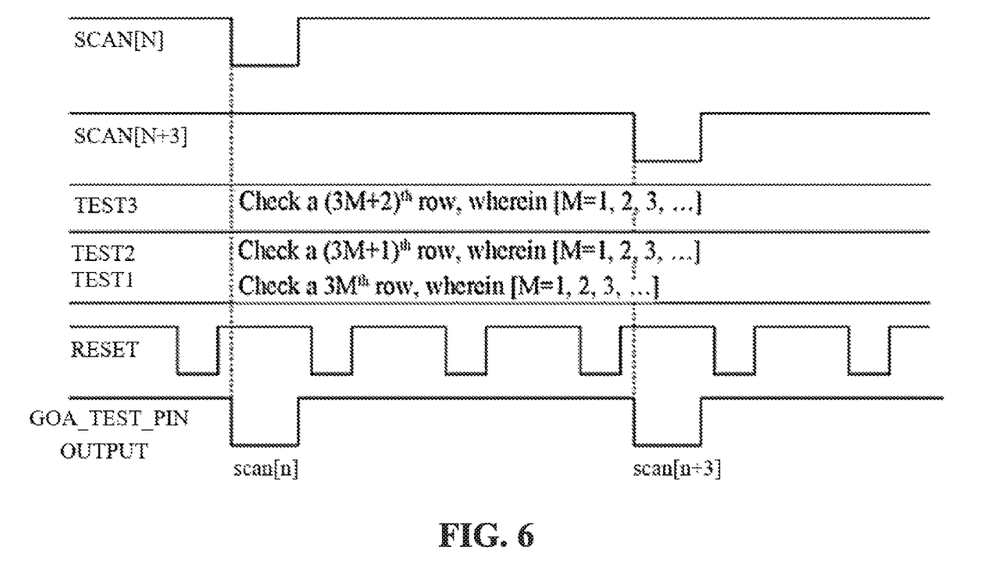
FIG. 6 is a schematic diagram of a detection time sequence when the GOA unit in the GOA detection circuit is normal according to the second embodiment of the present disclosure, wherein the normal GOA unit outputs a negative voltage pulse signal.

Referring to FIG. 5 and FIG. 6, the second embodiment is as follows: A low-level voltage signal VGL is input to the detection signal control wire TEST, a low-level voltage signal VGL is input to the single-stage signal control wire (which is TEST1 herein), and a high-level voltage signal VGH is input to other single-stage signal control wires (TEST2 and TEST3). Therefore, the common control TFT 212 and a single-stage control TFT 214 are in the on state, and other single-stage control TFTs (for example, 215 and 216) are in the off state, and then, detection on whether there is a multi-pulse phenomenon in signals output by all GOA units 213 in a [3N−2]$^{th}$ column can start. Under the protection of the unilateral conduction component, signals output by the GOA units cause no mutual interference between different stages, to be more specific, a GOA signal stage-transmission function is not affected. As shown in FIG. 5 and FIG. 6, scanning signals SCAN[N] to SCAN[N+3] indicate output signals of stages of GOA units, and a RESET signal is an AC signal, and is turned on before the output signal of each stage of GOA unit is turned on, to reset the entire detection circuit. GOA_TEST_PIN OUTPUT is a waveform detected by the test point 223 for detecting a voltage signal. As shown in FIG. 5 and in combination with FIG. 1, when a GOA unit [N−5] is damaged, in an effect diagram of a detection time sequence, it is shown that a pulse normally appears within a time period corresponding to scanning signal SCAN [N] in GOA_TEST_PIN OUTPUT, but, pulses also appear within time periods corresponding to scanning signals SCAN[N+1] and SCAN[N+2], namely, a multi-pulse phenomenon. Therefore, it may be considered that an abnormal waveform is detected. However, in FIG. 5, when a GOA unit GOA[N−2] is normal, a waveform corresponding to the scanning signal SCAN[N+3] corresponding to the GOA unit GOA[N−2] is in a normal state. Therefore, based on a design of the foregoing circuit, a multi-pulse signal output by each stage of GOA unit can be rapidly and quickly determined, to facilitate accurate locating and analysis of an abnormality problem of the GOA unit, and filtering of an array test of an LCD panel. In addition, after all GOA units in a [3N−2]$^{th}$ column are tested completely, all GOA units in a [3N−1]$^{th}$ column and all GOA units in a [3N]$^{th}$ column are detected. In the present embodiment, the single-stage control TFTs (for example, 114, 115, and 116) are alternately turned on, to obtain three groups of signals of GOA_TEST_PIN OUTPUT, such that a position at which an abnormal multi-pulse signal appears in all the GOA units can be detected.

Figure 7:
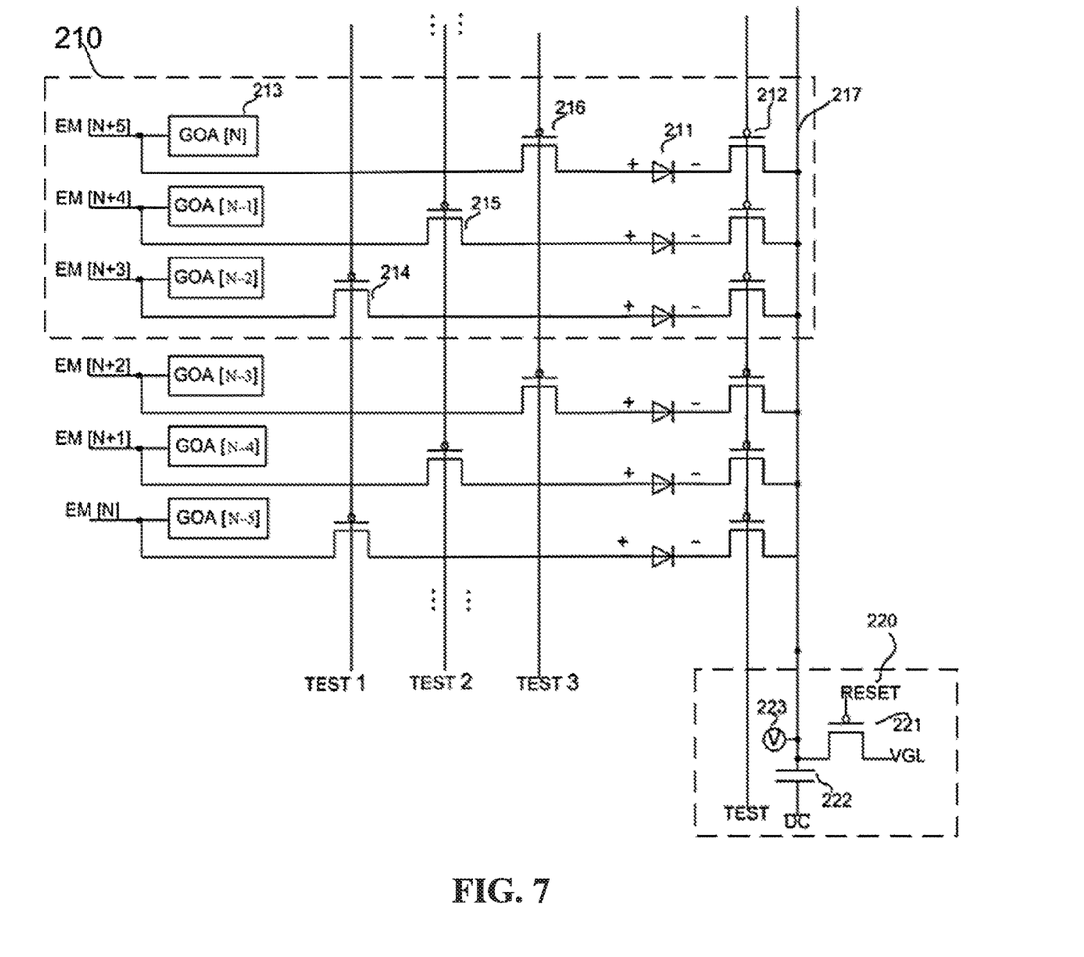
FIG. 7 is a schematic diagram of a GOA detection circuit according to a third embodiment 3 of the present disclosure, wherein a GOA unit outputs a positive voltage pulse signal.

FIG. 1 to FIG. 6 show detection circuit designed when the GOA unit outputs a negative voltage pulse signal. When the GOA unit outputs a positive voltage pulse signal, the detection circuit requires to be modified as follows. Referring to FIG. 7 and FIG. 1, polarities of two ends of a unilateral conduction component 211 in FIG. 7 are reverse to polarities of two ends of the unilateral conduction component 111 in FIG. 1, and the drain of the reset control TFT receives a low-level voltage signal. The rest of the circuit design is same as that of the detection circuit in FIG. 1. In addition, the unilateral conduction component 211 in FIG. 7 uses a unilateral conduction control TFT. A source of the unilateral conduction control TFT is electrically connected to a gate of the unilateral conduction control TFT using a phase inverter; or a drain of the unilateral conduction control TFT is electrically connected to a gate of the unilateral conduction control TFT. Other parts of a GOA detection circuit in the third embodiment shown in FIG. 7 are same as other parts of the GOA detection circuit shown in FIG. 1 (for example, a test point 223 for detecting a voltage signal in FIG. 7 is same as the test point 123 for detecting a voltage signal in FIG. 1, a capacitor 222 in FIG. 7 is same as the capacitor 122 in FIG. 1, a reset component 121 in FIG. 7 is same as the reset component 221 in FIG. 1, a GOA unit 213 in FIG. 7 is same as the GOA unit 113 in FIG. 1, single-stage control TFTs (214, 215, and 216) in FIG. 7 are same as the single-stage control TFTs (114, 115, and 116) in FIG. 1, a common control TFT 212 in FIG. 7 is same as the common control TFT 112 in FIG. 1, and so on), and details are not described herein again. EM[N+5], EM[N+4], EM[N+3], and the like respectively indicate different optical signals.

In addition, the present disclosure further provides a testing method for a GOA detection circuit.

Figure 8:
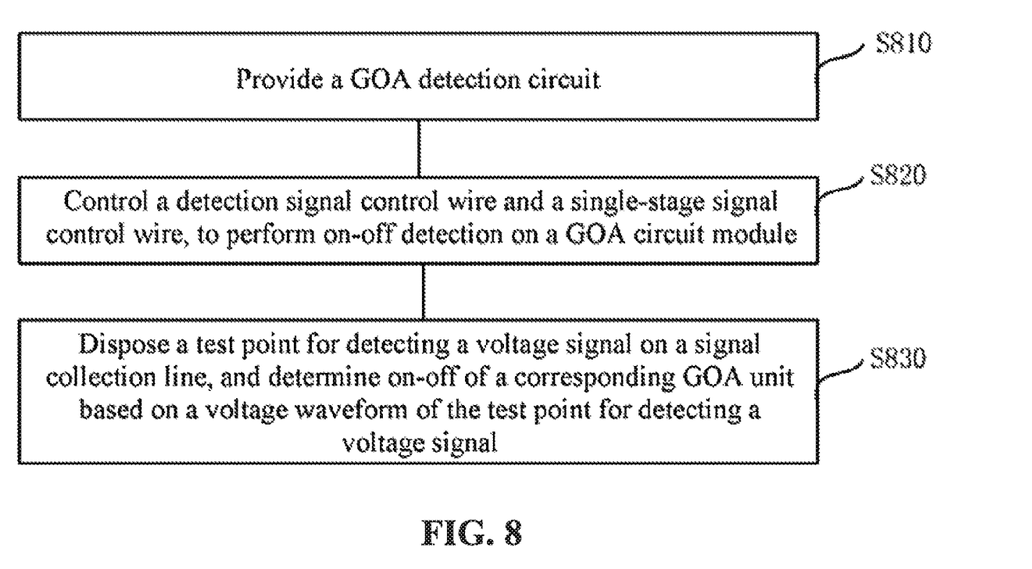
FIG. 8 is a flowchart of steps of a detection method for the GOA detection circuit according to the present disclosure.

Referring to FIG. 8, the method includes the following steps.

Step S810: Provide a GOA detection circuit. The GOA detection circuit includes a GOA circuit module and a detection signal collection module. The GOA circuit module includes a plurality of scanning lines spaced in parallel and a GOA circuit electrically connected to the plurality of scanning lines. An output end of each scanning line is electrically connected to a signal collection line. The GOA circuit includes a plurality of cascaded GOA units. Each GOA unit is electrically connected to a scanning signal output end; each scanning signal output end is correspondingly electrically connected to a scanning line. The GOA circuit module further includes a plurality of common control TFTs and a plurality of single-stage control TFTs. A gate of each common control TFT is electrically connected to a detection signal control wire of the detection signal collection module. A source of each common control TFT is electrically connected to the signal collection line. Each scanning line has a single-stage control TFT. A drain of each single-stage control TFT Each scanning signal output end is electrically connected to a drain of the single-stage control TFT disposed on the corresponding scanning line. A drain of each common control TFT is electrically connected to a source of the corresponding single-stage control TFT. A gate of each single-stage control TFT is electrically connected to a single-stage signal control wire.

For a specific structure of the GOA detection circuit, refer to the foregoing descriptions, and details are not described herein again.

Step S820: Control the detection signal control wire and the single-stage signal control wire, to perform on-off detection on the GOA circuit module.

In the step S820, when an input voltage of the detection signal control wire is at a low level, and an input voltage of each single-stage signal control wire is a low-level voltage, each single-stage control TFT in the GOA circuit module is in an on state, to perform on-off detection on each GOA unit. To be specific, a low-level voltage signal is input to the detection signal control wire. Similarly, a low-level voltage signal is input to the single-stage signal control wires (for example, TEST1, TEST2, and TEST3). Therefore, the common control TFT and the single-stage control TFT are in the on state, and then on-off detection on the GOA unit can start. Under the protection of the unilateral conduction component, signals output by the GOA units cause no mutual interference between different stages, to be specific, a GOA signal stage-transmission function is not affected. For example, when a signal SCAN[N+2] is abnormally output, to be specific, a corresponding GOA unit (GOA[N−3]) is damaged, in a schematic diagram of a signal testing effect, it is shown that no corresponding pulse appears within a time corresponding to scanning signals SCAN[N+2]. However, output signals of stages of GOA units indicated by scanning signals SCAN[N] to SCAN[N+4] are all normal, and in a schematic diagram of a signal testing effect, a normal detection pulse corresponding to each stage of GOA is shown. Therefore, based on implementation of the step S820 and the step S830, an abnormal signal of each stage of GOA unit can be rapidly and accurately determined, to facilitate accurate locating and analysis of an abnormality problem of the GOA unit, and filtering of an array test of an LCD panel.

In addition, in the step S820, when an input voltage of the detection signal control wire is at a low level, an input voltage of one of the plurality of single-stage signal control wires is a low voltage, and input voltages of the other single-stage signal control wires are high voltages, a single-stage control TFT, in the GOA circuit module, corresponding to the single-stage signal control wire whose input voltage is the low voltage is in an on state, and the other single-stage control TFTs are in an off state, to perform on-off detection on the corresponding GOA unit. To be specific, a low-level voltage signal is input to the detection signal control wire, a low-level voltage signal is input to the single-stage signal control wire (for example, TEST1), and a high-level voltage signal is input to other single-stage signal control wires (TEST2 and TEST3). Therefore, the common control TFT and a single-stage control TFT are in the on state, and other single-stage control TFTs are in the off state, and then, detection is implement to obtain whether there is a multi-pulse phenomenon in signals output by all GOA units in a $[3N-2]^{th}$ column or not. When a GOA unit [N−5] is damaged, in an effect diagram of a detection time sequence, it is shown that a pulse normally appears in signal GOA_TEST_PIN OUTPUT during a time period corresponding to scanning signal SCAN[N], also, pulses, i.e. multi-pulse phenomenon, appear during corresponding time periods in scanning signals SCAN[N+1] and SCAN[N+2]. Therefore, it may be considered that an abnormal waveform is detected. However, when a GOA unit GOA[N−2] is normal, a waveform corresponding to scanning signal SCAN[N+3] corresponding to the GOA unit GOA[N−2] is in a normal state. Therefore, based on a design of the foregoing circuit, a multi-pulse signal output by each stage of GOA unit can be rapidly and quickly determined, to facilitate accurate locating and analysis of an abnormality problem of the GOA unit, and filtering of an array test of an LCD panel.

Step S830: Dispose a test point for detecting a voltage signal on the signal collection line, and determine on-off status of a corresponding GOA unit according to a voltage waveform of the test point for detecting a voltage signal.

In addition, before the step S820 or after the step S830, the method further includes: before each GOA unit outputs a signal, a reset component 121 of the detection signal collection module receive a reset signal to reset the GOA circuit module.

According to the present disclosure, compared with an original GOA stage-transmission circuit, a data collection wire and a TFT are added to the GOA detection circuit, and a unilateral conduction control TFT working as a unilateral conduction diode is configured to block interference between different stages of GOA signals. A time signal control system is adjusted (including controlling a detection signal control wire and a reset signal) in order to collect information, in a signal, indicating whether reading each stage of GOA signal is abnormal. In addition, the unilateral conduction control TFT is controlled using a plurality of groups of signals, to implement multi-pulse abnormality detection and determine an abnormality position. According to the testing method, a yield of a GOA unit can be rapidly determined, and a fault of the GOA unit and a multi-pulse position can be accurately determined, to facilitate later repairing, fault analysis, and design improvement of a display panel.

INDUSTRIAL APPLICABILITY

The subject matter in this application can be manufactured and used in the industry and has industrial applicability.

What is claimed is:

1. A gate on array (GOA) detection circuit, comprising: a GOA circuit module and a detection signal collection module, wherein the GOA circuit module comprises a plurality of scanning lines spaced in parallel and a GOA circuit electrically connected to the plurality of scanning lines; an output end of each of the scanning line is electrically connected to a signal collection line; the GOA circuit comprises a plurality of cascaded GOA units; each of the GOA unit is electrically connected to a scanning signal output end; each of the scanning signal output end is correspondingly electrically connected to one of the scanning line; the GOA circuit module further comprises a plurality of common control thin film transistors (TFT) and a plurality of single-stage control TFTs; a gate of each of the common control TFT is electrically connected to a detection signal control wire of the detection signal collection module; a source of each of the common control TFT is electrically connected to the signal collection line; each of the single-stage control TFT is disposed on one of the scanning line; a drain of each of the single-stage control TFT is electrically connected to one of the scanning signal output end; a source of each of the single-stage control TFT is electrically connected to a drain of a corresponding common control TFT; a gate of each of the single-stage control TFT is electrically connected to a single-stage signal control wire; a test point for detecting an electrical signal is disposed on the signal collection line; the GOA circuit module further comprises a plurality of unilateral conduction components; each unilateral conduction component is disposed on one of the scanning line; the unilateral conduction component is configured to prevent mutual interference between output signals of different stages of the GOA units; and the gate of each of the common control TFT and the gate of each of the single-stage control TFT are electrically connected to a phase inverter.

2. A gate on array (GOA) detection circuit, comprising: a GOA circuit module and a detection signal collection module, wherein the GOA circuit module comprises a plurality of scanning lines spaced in parallel and a GOA circuit electrically connected to the plurality of scanning lines; an output end of each of the scanning line is electrically connected to a signal collection line; the GOA circuit comprises a plurality of cascaded GOA units; each of the GOA unit is electrically connected to a scanning signal output end; each of the scanning signal output end is correspondingly electrically connected to one of the scanning line; the GOA circuit module further comprises a plurality of common control thin film transistors (TFT) and a plurality of single-stage control TFTs; a gate of each of the common control TFT is electrically connected to a detection signal control wire of the detection signal collection module; a source of each of the common control TFT is electrically connected to the signal collection line; each of the single-stage control TFT is disposed on one of the scanning line; a drain of each of the single-stage control TFT is electrically connected to one of the scanning signal output end; a source of each of the single-stage control TFT is electrically connected to a drain of a corresponding common control TFT; a gate of each of the single-stage control TFT is electrically connected to a single-stage signal control wire; and a test point for detecting an electrical signal is disposed on the signal collection line.

3. The GOA detection circuit according to claim 2, wherein the detection signal collection module further comprises a reset component and a capacitor; the reset component is a reset control TFT; a gate of the reset control TFT receives a reset signal; a source of the reset control TFT is electrically connected to the signal collection line; a drain of the reset control TFT receives a low-level voltage signal; when the gate of the reset control TFT receives the reset signal, the signal collection line obtains a voltage level according to the low-level voltage signal received by the drain of the reset control TFT; one end of the capacitor is connected to the signal collection line; and the capacitor is used for storing electrical charge.

4. The GOA detection circuit according to claim 2, wherein the detection signal collection module further comprises a reset component and a capacitor; the reset component is a reset control TFT; a gate of the reset control TFT receives a reset signal; a source of the reset control TFT is electrically connected to the signal collection line; a drain of the reset control TFT receives a high-level voltage signal; when the gate of the reset control TFT receives the reset signal, the signal collection line obtains a voltage level according to the high-level voltage signal received by the drain of the reset control TFT; one end of the capacitor is connected to the signal collection line; and the capacitor is used for storing electrical charge.

5. The GOA detection circuit according to claim 2, wherein the GOA circuit module further comprises a plurality of unilateral conduction components; each unilateral conduction component is disposed on one of the scanning line; and the unilateral conduction component is configured to prevent mutual interference between output signals of different stages of the GOA units.

6. The GOA detection circuit according to claim 5, wherein the unilateral conduction component is a unilateral conduction control TFT; and when an output signal of the GOA unit is a negative voltage pulse signal, a drain of the unilateral conduction control TFT is electrically connected to a gate of the unilateral conduction control TFT by a phase inverter.

7. The GOA detection circuit according to claim 5, wherein the unilateral conduction component is a unilateral conduction control TFT; and when an output signal of the GOA unit is a negative voltage pulse signal, a source of the unilateral conduction control TFT is electrically connected to a gate of the unilateral conduction control TFT.

8. The GOA detection circuit according to claim 5, wherein the unilateral conduction component is a unilateral conduction control TFT; and when an output signal of the GOA unit is a positive voltage pulse signal, a source of the unilateral conduction control TFT is electrically connected to a gate of the unilateral conduction control TFT by a phase inverter.

9. The GOA detection circuit according to claim 5, wherein the unilateral conduction component is a unilateral conduction control TFT; and when an output signal of the GOA unit is a positive voltage pulse signal, a drain of the unilateral conduction control TFT is electrically connected to a gate of the unilateral conduction control TFT.

10. The GOA detection circuit according to claim 4, wherein the gate of each of the common control TFT and the gate of each of the single-stage control TFT are electrically connected to a phase inverter.

11. A testing method for a gate on array (GOA) detection circuit, comprising the following steps:
(a) providing the GOA detection circuit, wherein the GOA detection circuit comprises a GOA circuit module and a detection signal collection module; the GOA circuit module comprises a plurality of scanning lines spaced in parallel and a GOA circuit electrically connected to the plurality of scanning lines; an output end of each of the scanning line is electrically connected to a signal collection line; the GOA circuit comprises a plurality of cascaded GOA units; each of the GOA unit is electrically connected to a scanning signal output end; each of the scanning signal output end is correspondingly electrically connected to one of the scanning line; the GOA circuit module further comprises a plurality of common control thin film transistors (TFT) and a plurality of single-stage control TFTs; a gate of each of the common control TFT is electrically connected to a detection signal control wire of the detection signal collection module, a source of each of the common control TFT is electrically connected to the signal collection line; each of the single-stage control TFT is disposed on one of the scanning line; a drain of each of the single-stage control TFT is electrically connected to one of the scanning signal output end; a source of each of the single-stage control TFT is electrically connected to a drain of a corresponding common control TFT; and a gate of each of the single-stage control TFT is electrically connected to a single-stage signal control wire;

(b) controlling the detection signal control wire and the single-stage signal control wire, to perform on-off detection on the GOA circuit module; and (c) disposing a test point for detecting a voltage signal of the signal collection line, and determining on-off of a corresponding GOA unit according to a voltage waveform of the test point.

12. The testing method according to claim 11, wherein in the step (b), when an input voltage of the detection signal control wire is at a low level, and an input voltage of each single-stage signal control wire is at a low level, each of the single-stage control TFT in the GOA circuit module is in an on state, to perform on-off detection on each of the GOA unit.

13. The testing method according to claim 11, wherein before the step (b), the method further comprises: before each of the GOA unit outputs a signal, receiving, by a reset component of the detection signal collection module, a reset signal, to reset the GOA circuit module.

14. The testing method according to claim 11, wherein in the step (b), when an input voltage of the detection signal control wire is at a low level, an input voltage of a first single-stage signal control wire is at a low level, and input voltages of the single-stage signal control wires except the first single-stage signal control wire are at high voltages, the input voltage of the detection signal control wire turns on the single-stage control TFT corresponding to first single-stage signal control wire and turns off the single-stage control TFTs corresponding to single-stage signal control wires except the first single-stage signal control wire in order to perform on-off detection on the corresponding GOA unit.

* * * * *

UNITED STATES PATENT AND TRADEMARK OFFICE
CERTIFICATE OF CORRECTION

PATENT NO. : 10,839,765 B2
APPLICATION NO. : 16/476321
DATED : November 17, 2020
INVENTOR(S) : Di Zhang Page 1 of 1

It is certified that error appears in the above-identified patent and that said Letters Patent is hereby corrected as shown below:

On the Title Page

Insert the following:
--(30) *Foreign Application Priority Data*
Sep. 25, 2018 (CN)...................... 201811118911.9--

Signed and Sealed this
Second Day of February, 2021

Drew Hirshfeld
*Performing the Functions and Duties of the
Under Secretary of Commerce for Intellectual Property and
Director of the United States Patent and Trademark Office*